(12) United States Patent
Ahmed

(10) Patent No.: US 9,136,355 B2
(45) Date of Patent: Sep. 15, 2015

(54) METHODS FOR FORMING AMORPHOUS SILICON THIN FILM TRANSISTORS

(71) Applicant: Intermolecular, Inc., San Jose, CA (US)

(72) Inventor: Khaled Ahmed, Anaheim, CA (US)

(73) Assignee: Intermolecular, Inc., San Jose, CA (US)

( * ) Notice: Subject to any disclaimer, the term of this patent is extended or adjusted under 35 U.S.C. 154(b) by 22 days.

(21) Appl. No.: 14/095,834

(22) Filed: Dec. 3, 2013

(65) Prior Publication Data

US 2015/0155368 A1 Jun. 4, 2015

(51) Int. Cl.
*H01L 21/00* (2006.01)
*H01L 29/66* (2006.01)

(52) U.S. Cl.
CPC ................... *H01L 29/66765* (2013.01)

(58) Field of Classification Search
CPC ................... H01L 29/66; H01L 29/786
USPC .................................. 438/104, 158
See application file for complete search history.

(56) References Cited

U.S. PATENT DOCUMENTS

| 2006/0108585 | A1* | 5/2006 | Gan et al. ................... 257/66 |
| 2007/0215954 | A1* | 9/2007 | Mouli ....................... 257/390 |
| 2009/0085033 | A1* | 4/2009 | Su et al. ...................... 257/59 |
| 2009/0289258 | A1* | 11/2009 | Kim et al. .................... 257/66 |
| 2011/0186824 | A1* | 8/2011 | Yagi .......................... 257/40 |
| 2011/0215324 | A1* | 9/2011 | Shen et al. .................. 257/57 |
| 2011/0269274 | A1* | 11/2011 | Furuta et al. ................ 438/158 |
| 2012/0056180 | A1* | 3/2012 | Chen .......................... 257/57 |
| 2012/0080753 | A1* | 4/2012 | Singh et al. ................. 257/347 |
| 2012/0223303 | A1* | 9/2012 | Ye ............................ 257/43 |
| 2013/0015448 | A1* | 1/2013 | Yang et al. ................... 257/59 |
| 2013/0029462 | A1* | 1/2013 | Yagi .......................... 438/151 |
| 2013/0313621 | A1* | 11/2013 | Yamada et al. .............. 257/292 |
| 2014/0001464 | A1* | 1/2014 | Park et al. ................... 257/43 |
| 2014/0152936 | A1* | 6/2014 | Kim et al. .................... 349/43 |
| 2014/0273340 | A1* | 9/2014 | Van Duren et al. .......... 438/104 |
| 2014/0346495 | A1* | 11/2014 | Shieh et al. .................. 257/43 |

OTHER PUBLICATIONS

Han et al.; Self-assembled Nanolayers as Interfacial Diffusion Barriers for Thermally Stable and Low Contact Resistance Cu Source/Drain Electrode in a-Si:H TFT-LCDs; 2012; Electronic Materials Letters, vol. 8, No. 1, pp. 21-25.

Agrawal et al.; A unified model for insulator selection to form ultra-low resistivity metal-insulator-semiconductor contacts to n-Si, n-Ge, and n-InGaAs; Jul. 26, 2012; Applied Physics Letters; American Institute of Physics; pp. 042108-1-042108-4.

* cited by examiner

*Primary Examiner* — Caleb Henry

(57) ABSTRACT

Embodiments described herein provide amorphous silicon thin-film transistors (a-Si TFTs) and methods for forming a-Si TFTs. A substrate is provided. A gate electrode is formed above the substrate. An a-Si channel layer is formed above the gate electrode. A contact layer is formed above the a-Si channel layer. The contact layer includes titanium, zinc, arsenic, or a combination thereof. A source electrode and a drain electrode are formed above the contact layer.

13 Claims, 12 Drawing Sheets

METHODS FOR FORMING AMORPHOUS SILICON THIN FILM TRANSISTORS

TECHNICAL FIELD

The present invention relates to amorphous silicon thin-film transistors. More particularly, this invention relates to amorphous silicon thin-film transistors with reduced electrode contact resistivity and methods for forming such thin-film transistors.

BACKGROUND OF THE INVENTION

Amorphous silicon thin-film transistors (a-Si TFTs) are commonly used in, for example, display device applications due to low manufacturing costs and relatively good performance. However, the drive current of a-Si TFTs is usually limited by low electron mobility in the a-Si channel.

Conventional a-Si TFTs also typically include source and drain electrodes that are formed directly on the a-Si channel. Such an arrangement results in relatively high contact resistivity (e.g., greater than 100 $\mu\Omega$-cm$^2$) which may further limit the drive current in a-Si TFTs.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Embodiments described herein provide amorphous silicon (a-Si) thin-film transistors (TFTs) with improved (i.e., increased) drive current. In some embodiments, this is accomplished by reducing the specific contact resistivity (e.g., to below 100 $\mu\Omega$-cm$^2$) between the source and drain electrodes and the channel layer.

In some embodiments, the specific contact resistivity between the metal and the a-Si at the source and drain terminals is reduced by forming a thin dielectric layer between the a-Si and the source and drain electrodes. The dielectric layer may include titanium and/or zinc. In some embodiments, the dielectric layer is made of titanium oxide, zinc oxide, or a combination thereof.

In some embodiments, the specific contact resistivity between the metal and the a-Si at the source and drain terminals is reduced by doping the n+ doped a-Si (usually formed on top of the un-doped a-Si, below the source and drain) with arsenic. The n+ a-Si layer may be deposited using physical vapor deposition (PVD) in which the material is ejected from a target including arsenic-doped silicon.

Figure 1:
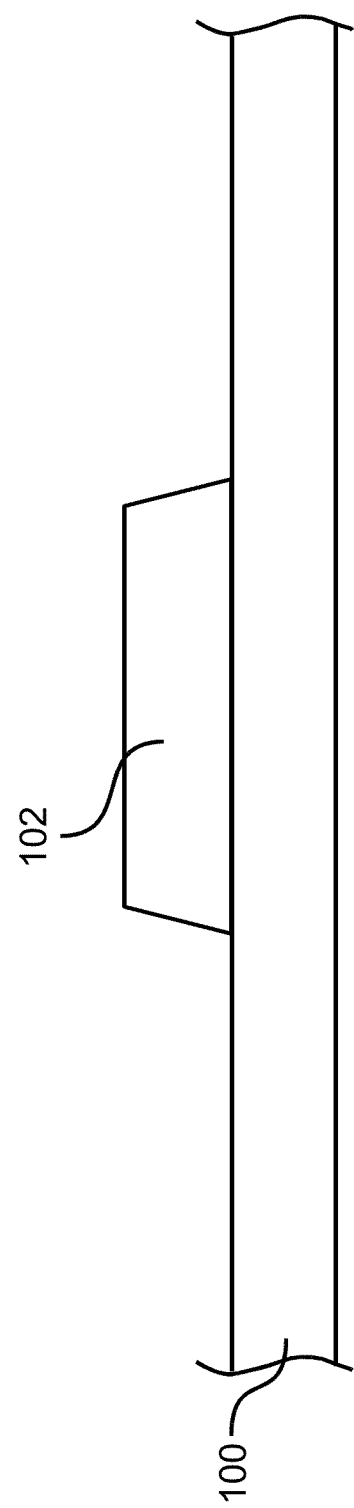
FIG. 1 is a cross-sectional view of a substrate with gate electrode formed above.

FIGS. 1-8 illustrate a method for forming an a-Si TFT according to some embodiments. Referring now to FIG. 1, a substrate 100 is shown. In some embodiments, the substrate 100 is at least partially made of a semiconductor material (e.g., silicon, germanium, gallium arsenide, etc.). In some embodiments, the substrate includes glass (e.g., a glass substrate with a layer of semiconductor material formed thereon). The substrate 100 may have a dielectric layer (e.g., silicon oxide) formed above an upper surface thereof. In such embodiments, the components described below are formed above the dielectric layer. The substrate 100 may have a thickness of, for example, between 0.01 and 0.5 centimeters (cm). Although only a portion of the substrate 100 is shown, it should be understood that the substrate 100 may have a width of, for example, between 5.0 cm and 4.0 meters (m).

Still referring to FIG. 1, a gate electrode 102 is formed above the substrate 100. In some embodiments, the gate electrode 102 is made of a conductive material, such as copper, silver, aluminum, manganese, molybdenum, or a combination thereof (e.g., sub-layers of different materials). The gate electrode may have a thickness of, for example, between about 20 nanometers (nm) and about 500 nm. Although not shown, it should be understood that in some embodiments, a seed layer (e.g., a copper alloy) is formed between the substrate 100 and the gate electrode 102.

It should be understood that the various components on the substrate, such as the gate electrode 102 and those described below, are formed using processing techniques suitable for the particular materials being deposited, such as PVD (e.g., co-sputtering in some embodiments), chemical vapor deposition (CVD), plasma-enhanced CVD (PECVD), electroplating, etc. Furthermore, although not specifically shown in the figures, it should be understood that the various components on the substrate 100, such as the gate electrode 102, may be sized and shaped using a photolithography process and an etching process, as is commonly understood, such that the components are formed above selected regions of the substrate 100.

Figure 2:
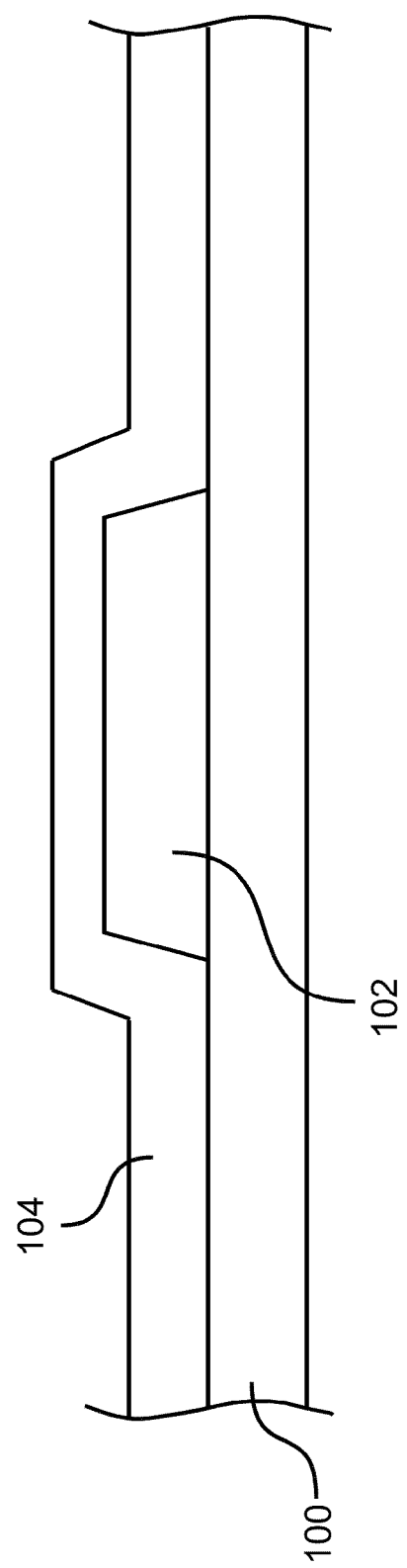
FIG. 2 is a cross-sectional view of the substrate of FIG. 1 with a gate dielectric layer formed above the gate electrode and the substrate.

Referring to FIG. 2, a gate dielectric layer 104 is then formed above the gate electrode 102 and the exposed portions of the substrate 100. The gate dielectric layer 104 may be made of, for example, silicon oxide, silicon nitride, or a high-k dielectric (e.g., having a dielectric constant greater than 3.9), such as zirconium oxide, hafnium oxide, or aluminum oxide. In some embodiments, the gate dielectric layer 104 has a thickness of, for example, between about 10 nm and about 500 nm.

Figure 3:
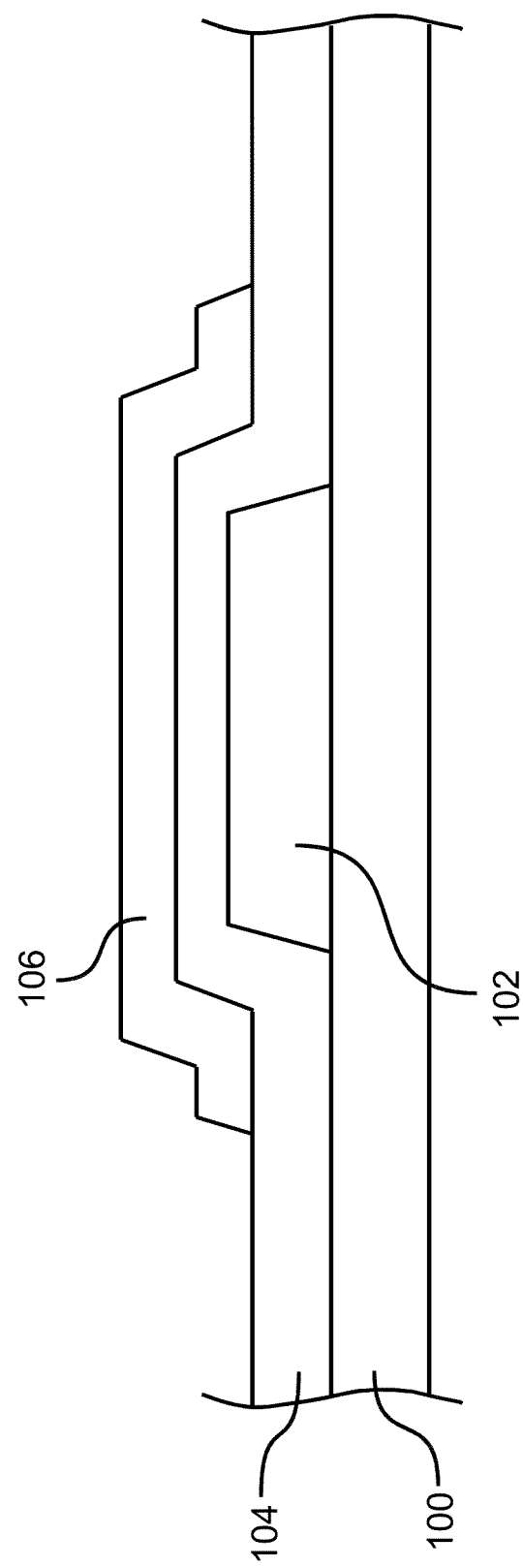
FIG. 3 is a cross-sectional view of the substrate of FIG. 2 with an amorphous silicon (a-Si) channel layer formed above the gate dielectric layer.

As shown in FIG. 3, an a-Si channel layer (or active layer) 106 is then formed above the gate dielectric layer 104, over the gate electrode 102. In some embodiments, the a-Si channel layer 106 is made of undoped a-Si, as is commonly understood. The a-Si channel layer 106 may have a thickness of, for example, between about 10 nm and about 100 nm.

Figure 4:
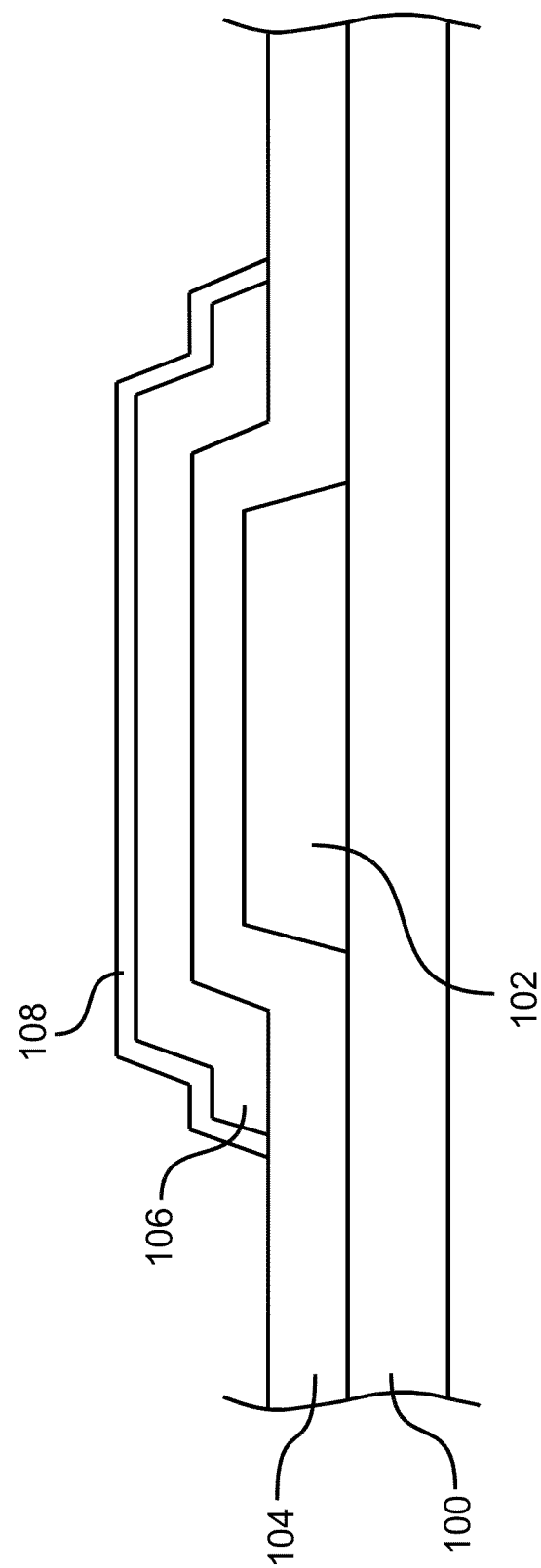
FIG. 4 is a cross-sectional view of the substrate of FIG. 3 with a doped a-Si layer formed above the a-Si channel layer.

Referring to FIG. 4, a doped a-Si layer 108 is then formed above the a-Si channel layer 106. In some embodiments, the doped a-Si layer 108 is made of N-type a-Si and doped with, for example, phosphorous or arsenic. The doping concentration of the doped a-Si layer 108 may be relatively high (e.g., N+ doped a-Si), such as greater than $1 \times 10^{19}$ cm$^{-3}$. In embodiments in which the doped a-Si layer 108 is doped with arsenic, the doped a-Si layer 108 may be formed using a PVD process in which the target(s) from which the material is ejected include arsenic-doped a-Si. The doped a-Si layer 108 may have a thickness of, for example, between about 5 nm and about 10 nm. For the purposes of this specification, the doped a-Si layer 108 may be referred to a (first) contact layer.

Figure 5:
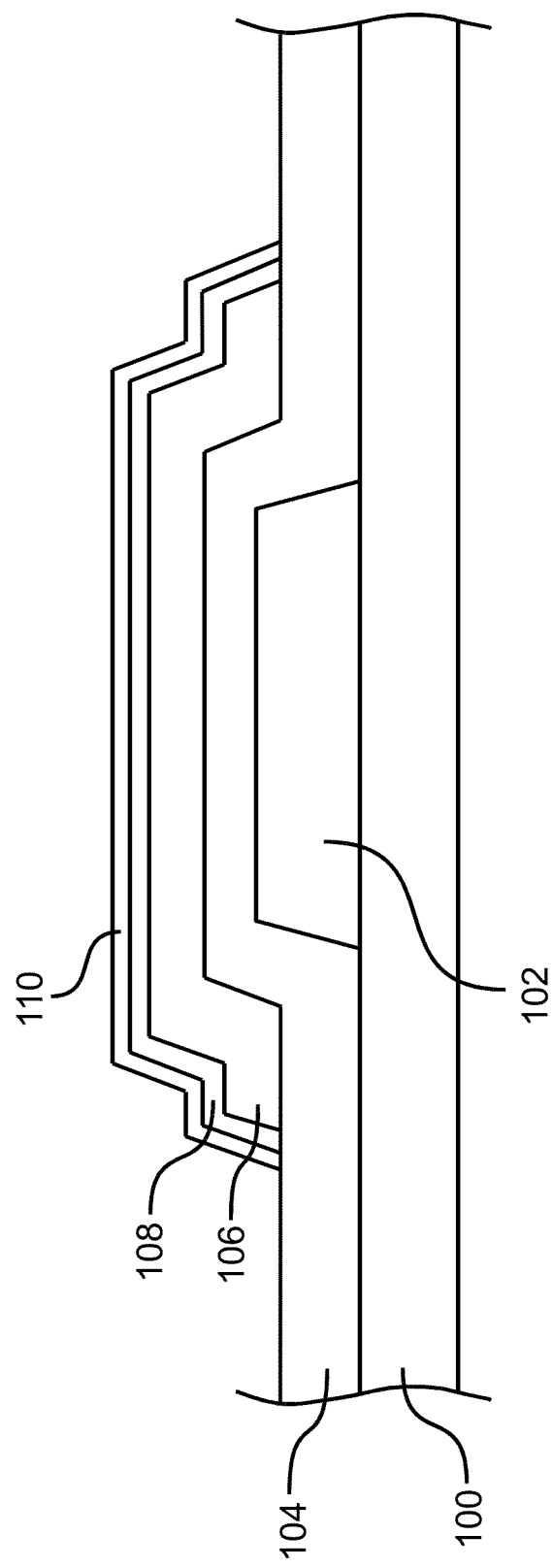
FIG. 5 is a cross-sectional view of the substrate of FIG. 4 with a contact layer formed above the doped a-Si layer.

Next, as shown in FIG. 5, a (second) contact layer 110 is formed above the doped a-Si layer 108. In some embodiments, the contact layer 110 includes (or is made of) a dielectric material. The contact layer 110 may include titanium, zinc, or a combination thereof. In some embodiments, the contact layer 110 is made of titanium oxide, zinc oxide, or a combination thereof. The contact layer 110 may have a thickness of, for example, between about 1 nm and about 3 nm.

The contact layer 110 may be formed using, for example, ALD or PVD. In embodiments in which the contact layer 110 is made of zinc oxide, the contact layer 110 may be formed using PVD in which the material is ejected from a target including zinc oxide (which may be doped with cadmium and/or germanium). In some embodiments, the doped a-Si layer (or first contact layer) 108 and the (second) contact layer 110 may be considered to jointly form a single contact layer.

Figure 6:
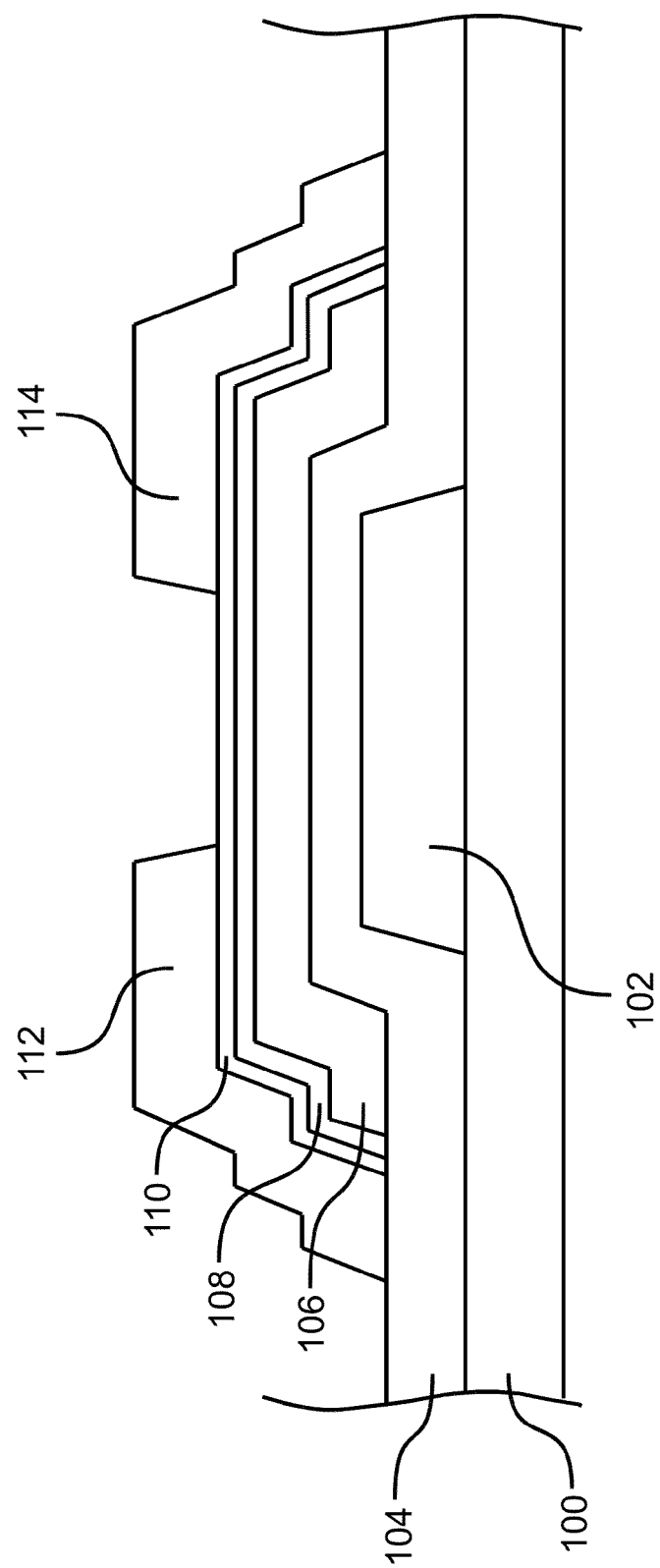
FIG. 6 is a cross-sectional view of the substrate of FIG. 5 with source and drain electrodes formed above the contact layer.

Referring now to FIG. 6, a source electrode (or region) 112 and a drain electrode 114 are formed above the contact layer 110. As shown, the source electrode 112 and the drain electrode 114 lie on opposing sides of, and partially overlap the ends of, the contact layer 110, the doped a-Si layer 108, and the a-Si channel layer 106. As will be appreciated by one skilled in the art, the source electrode 112 and the drain electrode 114 may be defined as shown in FIG. 6 using a "back-channel etch" (BCE) process to, for example, form the gap between the source electrode 112 and the drain electrode 114, which is vertically aligned with the gate electrode 102.

In some embodiments, the source electrode 112 and the drain region 114 are made of titanium, aluminum, molybdenum, copper, copper-manganese alloy, or a combination thereof. In some embodiments, the source electrode 112 and the drain electrode 114 include multiple sub-layers (e.g., sub-layers of titanium and titanium nitride). The source region 110 and the drain region 112 may have a thickness of, for example, between about 20 nm and 500 nm.

Figure 7:
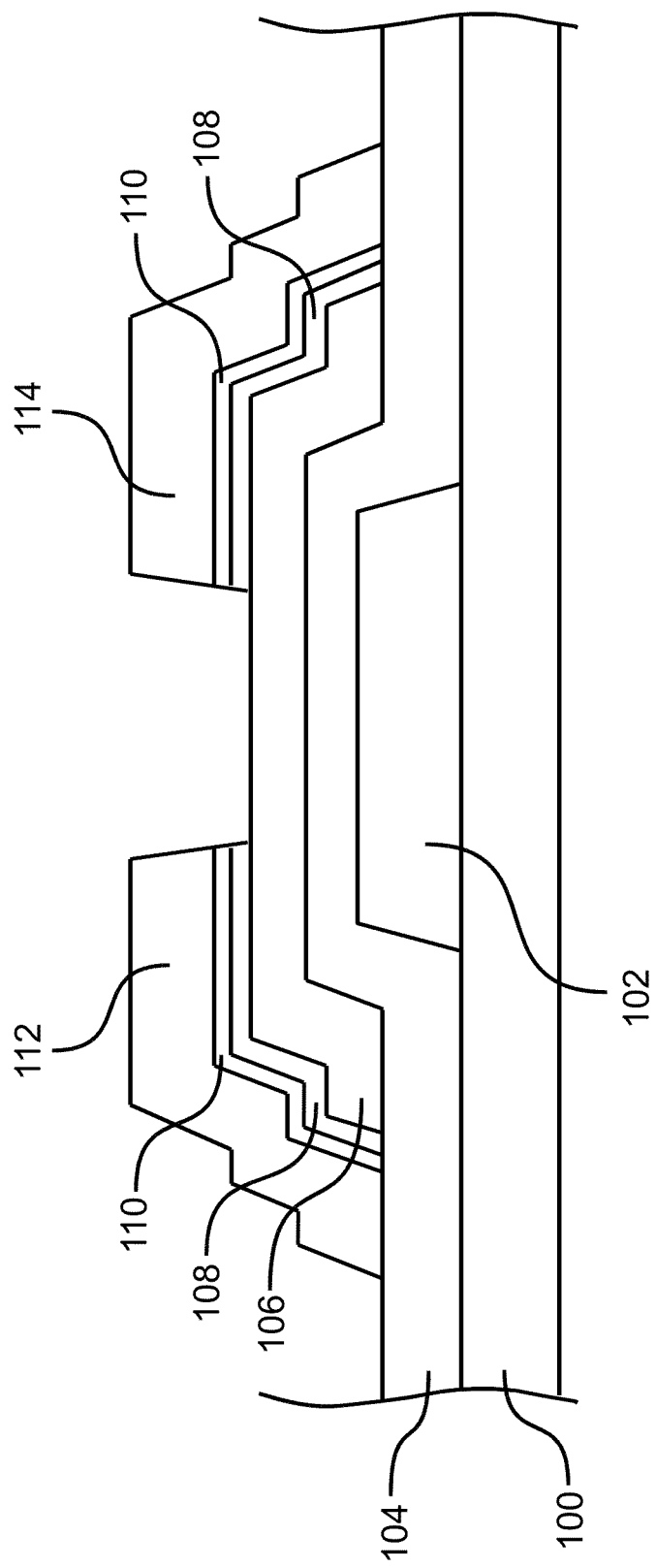
FIG. 7 is a cross-sectional view of the substrate of FIG. 6 after the portions of the contact layer and the doped a-Si layer between the source and drain electrodes have been removed.

As shown in FIG. 7, the portions of the contact layer 110 and the doped a-Si layer 108 between the source electrode 112 and the drain electrode 114 are then removed using an etching process (e.g., wet or dry etching process). In some embodiments, separate etching processes are used to remove the desired portions of the contact layer 110 and the doped a-Si layer 108. As shown, the portions of the contact layer 110 and the doped a-Si layer 108 positioned between the electrodes (i.e., the source electrode 112 and the drain electrode 114) and the a-Si channel layer 106 remain intact after the etching process(es).

Figure 8:
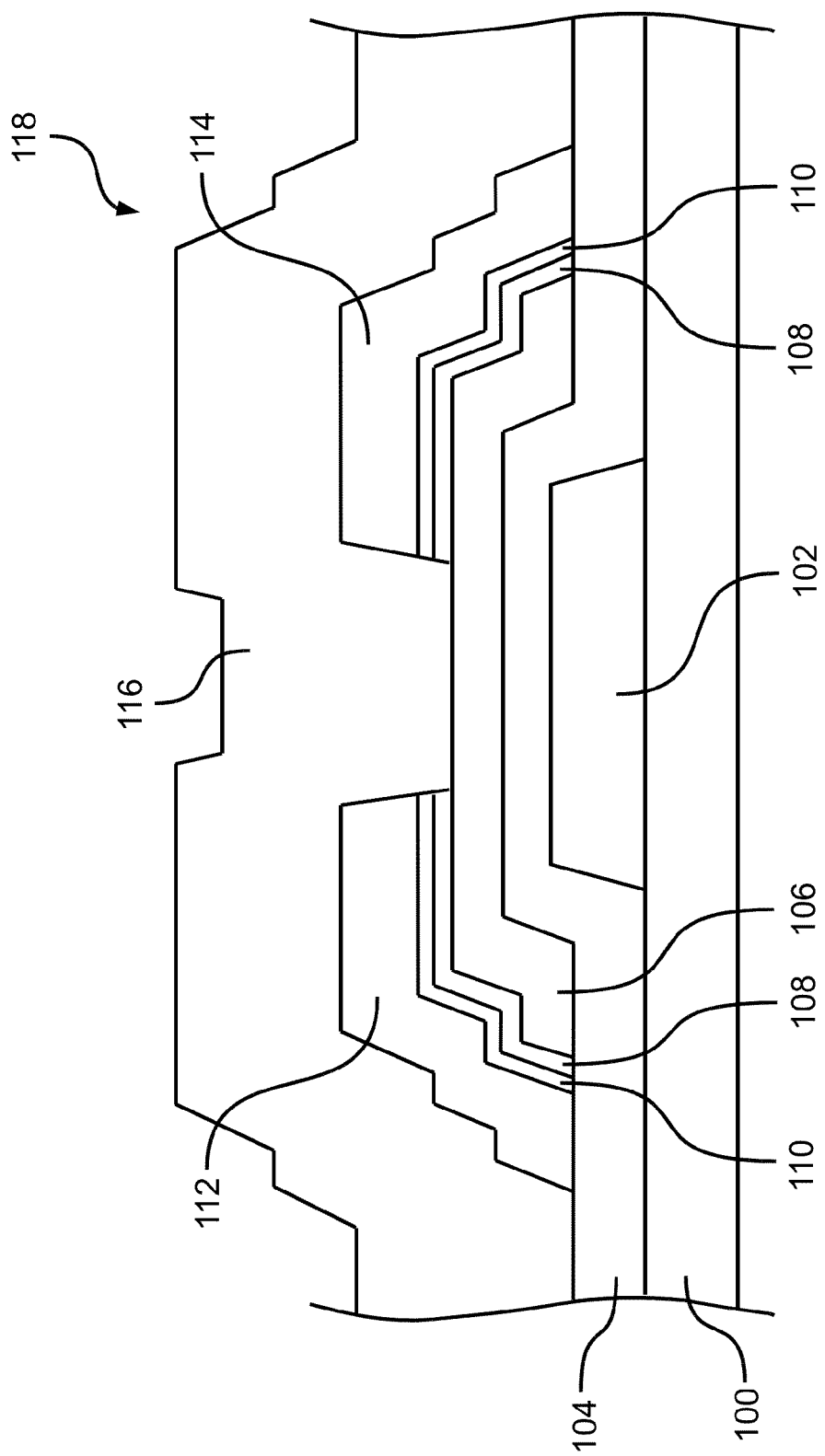
FIG. 8 is a cross-sectional view of the substrate of FIG. 7 with a passivation layer formed above the source and drain electrodes.

Referring to FIG. 8, a passivation layer 116 is then formed above the source electrode 112, the drain electrode 114, and the gate dielectric layer 104. In some embodiments, the passivation layer 114 is made of silicon oxide, silicon nitride, aluminum oxide, aluminum nitride, or a combination thereof and has a thickness of, for example, between about 0.1 μm and about 1.5 μm.

The deposition of the passivation layer 116 may substantially complete the formation of an a-Si TFT 118 (e.g., an inverted, staggered bottom-gate a-Si TFT). It should be understood that although only a single device 118 is shown as being formed on a particular portion of the substrate 100 in FIGS. 1-8, the manufacturing processes described above may be simultaneously performed on multiple portions of the substrate 100 such that multiple devices 118 are simultaneously formed, as is commonly understood. Further, although not shown, in some embodiments, such as those intended for use in display applications, pixel electrodes may also be formed above the substrate 100 during the formation of the a-Si TFT 118. The pixel electrodes may be made of a transparent conductive material, such as indium-tin oxide (ITO).

In some embodiments, the a-Si TFT 118 (or certain components thereof) may undergo an annealing process. In some embodiments, the annealing process includes a relatively low temperature (e.g., less than about 600° C., preferably less than about 450° C.) heating process in, for example, an ambient gaseous environment (e.g., nitrogen, oxygen, or ambient/air). The heating process may occur for between about 1 minute and about 200 minutes.

The presence of the contact layer 110 (e.g., titanium oxide and/or zinc oxide) between the doped a-Si layer 108 and the source and drain electrodes 112 and 114 (e.g., made of low workfunction metals, such as titanium) provides lower specific contact resistivity (e.g., below 100 μΩ-cm$^2$) compared to the source and drain electrodes being formed directly on the doped a-Si layer 108, as is typically the case in a-Si TFTs. As a result, the drive current of the a-Si TFT 118 is improved (or increased).

Figure 9:
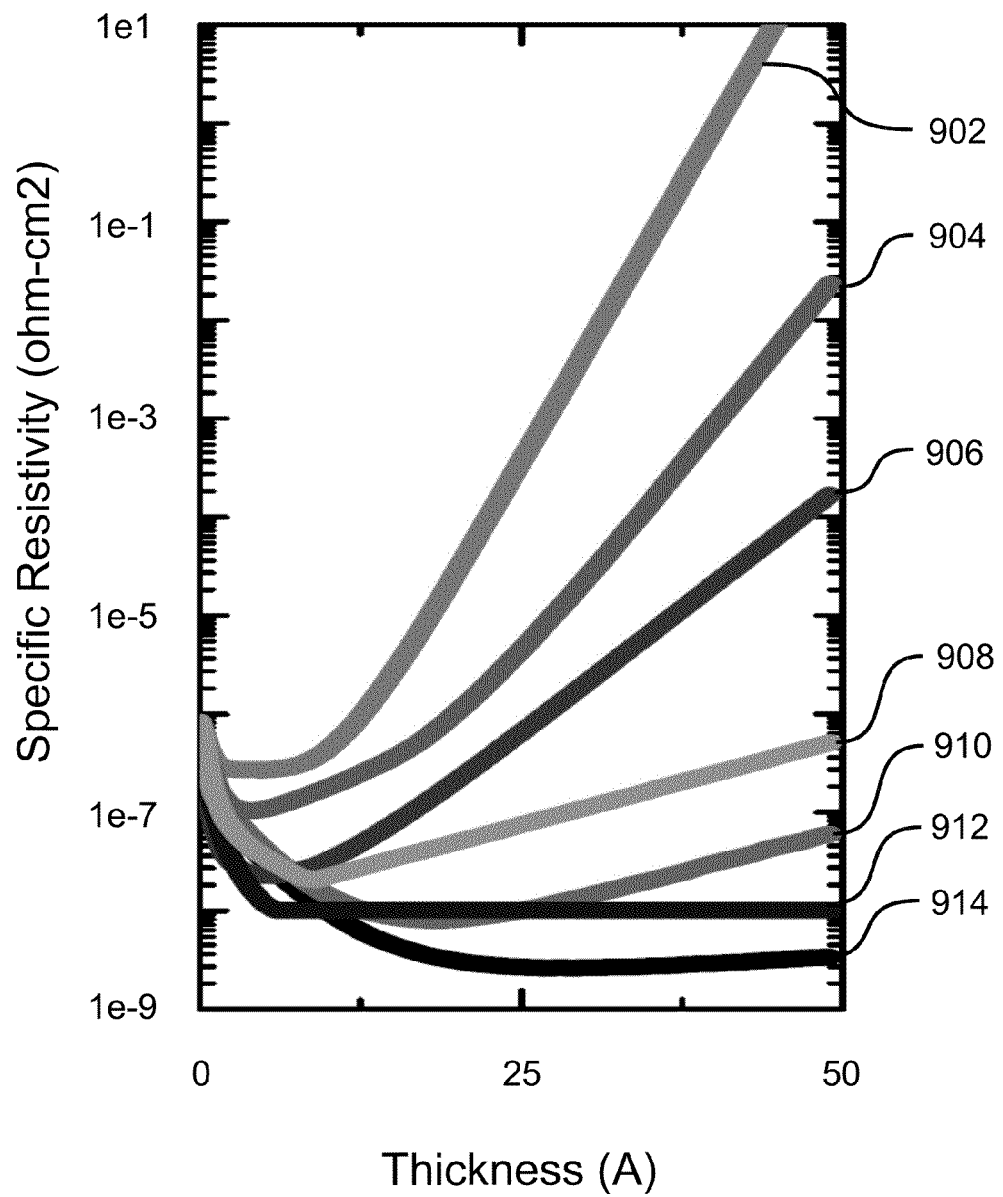
FIG. 9 is a graph depicting the specific contact resistivity as a function of insulator thickness for various dielectrics formed between aluminum and n-doped silicon

FIG. 9 graphically illustrates the specific contact resistivity as a function of insulator thickness for various dielectrics formed between aluminum and n-doped silicon. FIG. 9 was adapted from Applied Physics Letters 101, 042108 (2012), "A unified model for insulator selection to form ultra-low resistivity metal-insulator-semiconductor contacts to n-Si, n-Ge, and n-InGaAs," by Ashish Agrawal et al.

In FIG. 9, line 902 depicts the specific contact resistivity for lanthanum oxide. Line 904 depicts the same for zinc sulfide. Line 906 depicts strontium titanate, line 908 depicts zinc selenide, line 910 depicts tantalum oxide, line 912 depicts zinc oxide, and line 914 depicts titanium oxide. As shown, the specific contact resistivity is particularly low when zinc oxide and titanium oxide dielectrics are used as interfacial layers between the aluminum and the n-doped silicon, approaching as low as $1 \times 10^{-9}$ $\Omega$-cm$^2$ when titanium oxide is used.

Figure 10:
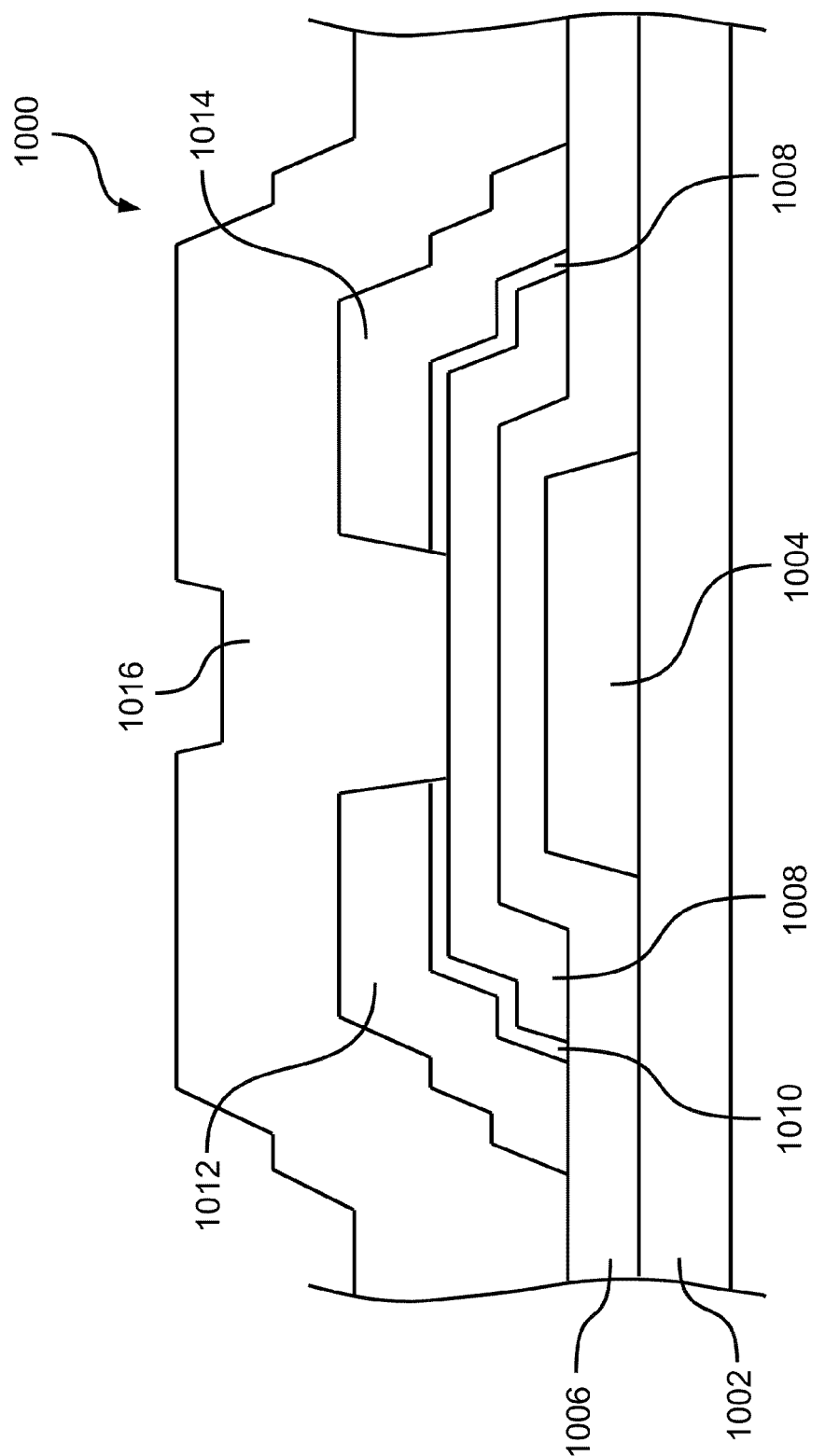
FIG. 10 is a cross-sectional view of an a-Si TFT according to some embodiments.

FIG. 10 illustrates an a-Si TFT 1000 according to some embodiments. The a-Si TFT 1000 may be similar to the a-Si TFT 118 shown in FIG. 8 and likewise include a substrate 1002, a gate electrode 1004, a gate dielectric layer 1006, an a-Si channel layer 1008, a doped a-Si layer 1010, a source electrode 1012, a drain electrode 1014, and a passivation layer 1016, which are similar to those described above. Of particular interest is that the a-Si TFT 1000 does not includes the contact layer 110 (e.g., made of titanium oxide) described above, and in some embodiments, the doped a-Si layer 1010 is doped with arsenic, as described above.

The relatively high doping density of the doped a-Si layer 1010 significantly reduces the contact resistance (e.g., to below 100 $\mu\Omega$-cm$^2$) between the a-Si channel layer 1008 and the source and drain electrodes 1012 and 1014. As a result, the drive current of the a-Si TFT 1000 is improved (or increased).

Figure 11:
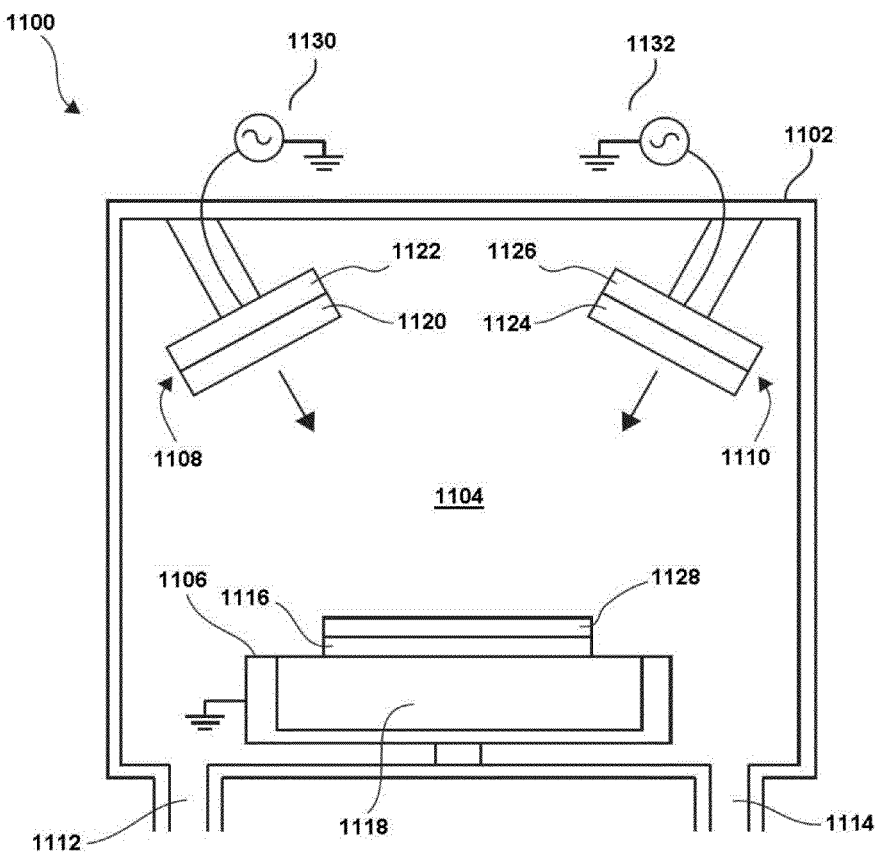
FIG. 11 is a simplified cross-sectional diagram illustrating a physical vapor deposition (PVD) tool according to some embodiments.

FIG. 11 provides a simplified illustration of a physical vapor deposition (PVD) tool (and/or system) 1100 which may be used, in some embodiments, to form the contact layers (and/or other components of the a-Si TFT) described above. The PVD tool 1100 shown in FIG. 11 includes a housing 1102 that defines, or encloses, a processing chamber 1104, a substrate support 1106, a first target assembly 1108, and a second target assembly 1110.

The housing 1102 includes a gas inlet 1112 and a gas outlet 1114 near a lower region thereof on opposing sides of the substrate support 1106. The substrate support 1106 is positioned near the lower region of the housing 1102 and in configured to support a substrate 1116. The substrate 1116 may be a round substrate having a diameter of, for example, about 200 mm or about 300 mm. In other embodiments (such as in a manufacturing environment), the substrate 1116 may have other shapes, such as square or rectangular, and may be significantly larger (e.g., about 0.5 to about 4 m across). The substrate support 1106 includes a support electrode 1118 and is held at ground potential during processing, as indicated.

The first and second target assemblies (or process heads) 1108 and 1110 are suspended from an upper region of the housing 1102 within the processing chamber 1104. The first target assembly 1108 includes a first target 1120 and a first target electrode 1122, and the second target assembly 1110 includes a second target 1124 and a second target electrode 1126. As shown, the first target 1120 and the second target 1124 are oriented or directed towards the substrate 1116. As is commonly understood, the first target 1120 and the second target 1124 include one or more materials that are to be used to deposit a layer of material 1128 on the upper surface of the substrate 1116.

The materials used in the targets 1120 and 1124 may, for example, include titanium, zinc, indium, gallium, tin, silicon, silver, aluminum, manganese, molybdenum, zirconium, hafnium, copper, or any combination thereof (i.e., a single target may be made of an alloy of several metals). In some embodiments, the materials used in the targets 1120 and 1124 include arsenic-doped silicon. Additionally, the materials used in the targets may include oxygen, nitrogen, or a combination of oxygen and nitrogen in order to form oxides, nitrides, and oxynitrides. Additionally, although only two targets 1120 and 1124 are shown, additional targets may be used.

The PVD tool 1100 also includes a first power supply 1130 coupled to the first target electrode 1122 and a second power supply 1132 coupled to the second target electrode 1124. As is commonly understood, in some embodiments, the power supplies 1130 and 1132 pulse direct current (DC) power to the respective electrodes, causing material to be, at least in some embodiments, simultaneously sputtered (i.e., co-sputtered) from the first and second targets 1120 and 1124. In some embodiments, the power is alternating current (AC) to assist in directing the ejected material towards the substrate 1116.

During sputtering, inert gases (or a plasma species), such as argon or krypton, may be introduced into the processing chamber 1104 through the gas inlet 1112, while a vacuum is applied to the gas outlet 1114. The inert gas(es) may be used to impact the targets 1120 and 1124 and eject material therefrom, as is commonly understood. In embodiments in which reactive sputtering is used, reactive gases, such as oxygen and/or nitrogen, may also be introduced, which interact with particles ejected from the targets (i.e., to form oxides, nitrides, and/or oxynitrides).

Although not shown in FIG. 11, the PVD tool 1100 may also include a control system having, for example, a processor and a memory, which is in operable communication with the other components shown in FIG. 11 and configured to control the operation thereof in order to perform the methods described herein.

Although the PVD tool 1100 shown in FIG. 11 includes a stationary substrate support 1106, it should be understood that in a manufacturing environment, the substrate 1116 may be in motion (e.g., an in-line configuration) during the formation of various layers described herein.

Figure 12:
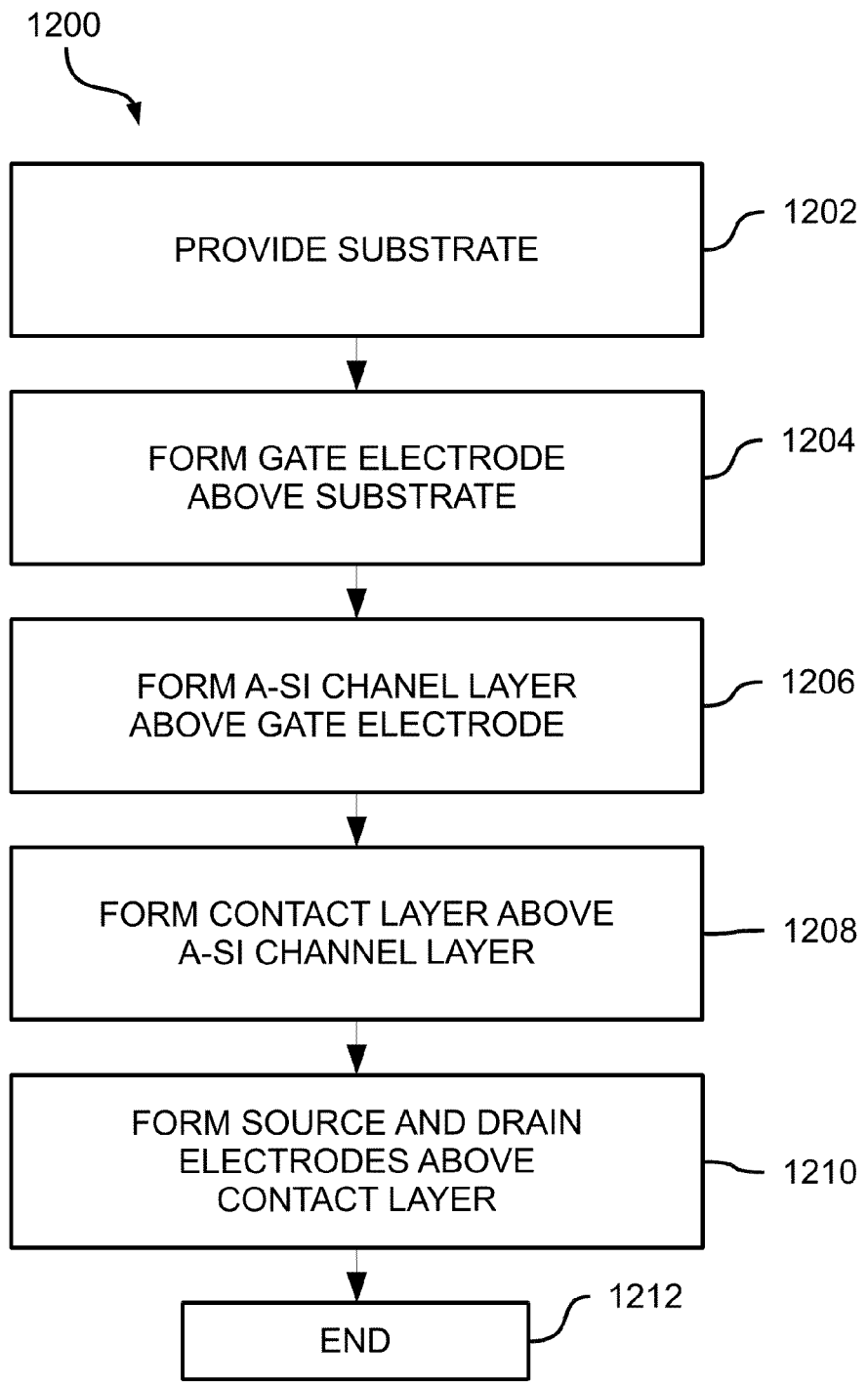
FIG. 12 is a flow chart illustrating a method for forming a-Si TFTs according to some embodiments.

FIG. 12 illustrates a method 1200 for forming an a-Si TFT according to some embodiments. At block 1202, the method 1200 begins with a substrate being provided. As described above, the substrate may be made of glass, a semiconductor material (e.g., silicon), or a combination thereof.

At block 1204, a gate electrode is formed above the substrate. The gate electrode may be made of, for example, copper, silver, aluminum, manganese, molybdenum, or a combination thereof. At block 1206, an a-Si channel layer is formed above the gate electrode. The a-Si channel layer may be made of undoped a-Si.

At block 1208, a contact layer is formed above the a-Si channel layer. In some embodiments, the contact layer is a dielectric layer which is formed above the a-Si layer after a doped a-Si is first formed above the a-Si channel layer. The dielectric layer may include titanium oxide, zinc oxide, or a combination thereof. In some embodiments (e.g., those not including the dielectric layer), the contact layer is made of arsenic-doped a-Si.

At block 1210, a source electrode and a drain electrode are formed above the contact layer. In some embodiments, the source electrode and the drain electrode are made of titanium, molybdenum, copper, copper-manganese alloy, or a combination thereof. In some embodiments, the source electrode and the drain electrode include multiple sub-layers (e.g., sub-layers of titanium and titanium nitride).

Although not shown, in some embodiments, the method 1200 also includes the formation of additional components of an a-Si TFT, such as a gate dielectric layer and a passivation layer. At block 1212, the method 1200 ends.

Thus, in some embodiments, a method for forming an a-Si TFT is provided. A substrate is provided. A gate electrode is formed above the substrate. An a-Si channel layer is formed above the gate electrode. A contact layer is formed above the a-Si channel layer. The contact layer includes titanium, zinc, arsenic, or a combination thereof. A source electrode and a drain electrode are formed above the contact layer.

In some embodiments, a method for forming an a-Si TFT is provided. A substrate is provided. A gate electrode is formed above the substrate. A gate dielectric layer is formed above the gate electrode. An a-Si channel layer is formed above the gate dielectric layer. A contact layer is formed above the a-Si channel layer. The contact layer includes titanium oxide, zinc oxide, or a combination thereof. A source electrode and a drain electrode are formed above the contact layer.

In some embodiments, a method for forming an a-Si TFT is provided. A substrate is provided. A gate electrode is formed above the substrate. A gate dielectric layer is formed above the gate electrode. An a-Si channel layer is formed above the gate dielectric layer. A n-doped a-Si layer is formed above the a-Si channel layer. The n-doped a-Si layer includes arsenic. A source electrode and a drain electrode are formed above the n-doped a-Si layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming an amorphous silicon (a-Si) thin-film transistor (TFT), the method comprising:
   providing a substrate;
   forming a gate electrode above the substrate;
   forming an a-Si channel layer above the gate electrode;
   forming a contact layer above the a-Si channel layer, wherein the contact layer comprises one of titanium oxide, zinc oxide, or a combination thereof, wherein the contact layer has a thickness of between about 1 nanometer (nm) and about 3 nm; and
   forming a source electrode and a drain electrode above the contact layer.

2. The method of claim 1, wherein the contact layer is formed using physical vapor deposition (PVD) or atomic layer deposition (ALD).

3. The method of claim 2, further comprising forming an n-doped a-Si layer above the a-Si channel layer, wherein the contact layer is formed above the n-doped a-Si layer.

4. A method for forming an amorphous silicon (a-Si) thin-film transistor (TFT), the method comprising:
   providing a substrate;
   forming a gate electrode above the substrate;
   forming an a-Si channel layer above the gate electrode;
   forming a contact layer above the a-Si channel layer, wherein the contact layer comprises arsenic-doped a-Si; wherein the contact layer has a thickness of between about 5 nm and about 15 nm and
   forming a source electrode and a drain electrode above the contact layer.

5. The method of claim 4, wherein the contact layer is formed using PVD, and wherein the formation of the contact layer comprises causing material to be ejected from a target, the target comprising arsenic-doped silicon.

6. A method for forming an amorphous silicon (a-Si) thin-film transistor (TFT), the method comprising:
   providing a substrate;
   forming a gate electrode above the substrate;
   forming a gate dielectric layer above the gate electrode;
   forming an a-Si channel layer above the gate dielectric layer;
   forming a contact layer above the a-Si channel layer, wherein the contact layer comprises titanium oxide, zinc oxide, or a combination thereof;
   forming a source electrode and a drain electrode above the contact layer; and
   forming an n-doped a-Si layer above the a-Si channel layer, wherein the contact layer is formed above the n-doped a-Si layer.

7. The method of claim 6, wherein the contact layer has a thickness of between about 1 nanometer (nm) and about 3 nm.

8. The method of claim 7, wherein the contact layer is formed using physical vapor deposition (PVD) or atomic layer deposition (ALD).

9. The method of claim 8, further comprising forming a passivation layer above the source electrode and the drain electrode.

10. A method for forming an amorphous silicon (a-Si) thin-film transistor (TFT), the method comprising:
    providing a substrate;
    forming a gate electrode above the substrate;
    forming a gate dielectric layer above the gate electrode;
    forming an a-Si channel layer above the gate dielectric layer;
    forming a n-doped a-Si layer above the a-Si channel layer, wherein the n-doped a-Si layer comprises arsenic, wherein the n-doped a-Si layer has a thickness of between about 5 nm and about 15 nm; and
    forming a source electrode and a drain electrode above the n-doped a-Si layer.

11. The method of claim 10, wherein the n-doped a-Si layer is formed using physical vapor deposition (PVD), and wherein the formation of the n-doped a-Si layer comprises causing material to be ejected from a target, the target comprising arsenic-doped silicon.

12. The method of claim 11, further comprising forming a passivation layer above the source electrode and the gate electrode.

13. The method of claim 12, wherein the substrate comprises glass, silicon, germanium, or a combination thereof.

* * * * *